United States Patent
Pape et al.

(10) Patent No.: US 10,306,776 B1
(45) Date of Patent: May 28, 2019

(54) SUBSTRATE PROCESSING SYSTEM PRINTED-CIRCUIT CONTROL BOARD ASSEMBLY WITH ONE OR MORE HEATER LAYERS

(71) Applicant: Lam Research Corporation, Fremont, CA (US)

(72) Inventors: Eric Pape, Campbell, CA (US); Changyou Jing, Livermore, CA (US); Fred Dennis Egley, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/825,682

(22) Filed: Nov. 29, 2017

(51) Int. Cl.
*H05K 1/02* (2006.01)
*H05K 3/46* (2006.01)
*H01L 21/683* (2006.01)
*H05K 3/24* (2006.01)
*H05K 3/00* (2006.01)
*H05K 3/42* (2006.01)

(52) U.S. Cl.
CPC .......... *H05K 3/46* (2013.01); *H01L 21/6831* (2013.01); *H05K 1/0212* (2013.01); *H05K 1/0298* (2013.01); *H05K 3/0017* (2013.01); *H05K 3/244* (2013.01); *H05K 3/429* (2013.01)

(58) Field of Classification Search
CPC ...... H05K 3/46; H05K 1/0212; H05K 1/0298; H05K 3/0017; H05K 3/244; H05K 3/429; H01L 21/6831
See application file for complete search history.

(56) References Cited

U.S. PATENT DOCUMENTS

| 5,671,116 | A | 9/1997 | Husain |
| 5,880,922 | A | 3/1999 | Husain |
| 6,184,494 | B1 | 2/2001 | Isokoski et al. |
| 6,541,736 | B1 * | 4/2003 | Huang ............... H05B 3/22 219/209 |
| 6,621,055 | B2 | 9/2003 | Weber et al. |
| 6,669,783 | B2 | 12/2003 | Sexton et al. |

(Continued)

OTHER PUBLICATIONS

Ghaffarian, Reza et al., "Accelerated Thermall Cycling and Failure Mechanisms for BGA and CSP Assemblies," Jet Propulsion Lab., California Inst. of Tech.; Pasadena, CA United States, pub. Mar. 30, 2000, 8 pages.

(Continued)

*Primary Examiner* — Steven T Sawyer

(57) ABSTRACT

A substrate processing system includes a processing chamber, a pedestal arranged in the processing chamber, and an electrostatic chuck (ESC) arranged on the pedestal. The ESC contains a printed circuit board assembly (PCBA) made up of a plurality of printed circuit board layers to mount circuitry that controls operation of the ESC. One or more of the printed circuit board layers includes a heater layer having one or more metal traces, which may be copper, to cover some or all of a surface of the heater layer sufficiently to provide heat to one or more of the remaining printed circuit board layers, to maintain the circuitry within a predetermined temperature range. The heat may be conducted directly among the various other printed circuit board layers, or may be conducted through vias in various ones of the printed circuit board layers.

19 Claims, 7 Drawing Sheets

(56) References Cited

U.S. PATENT DOCUMENTS

| | | |
|---|---|---|
| 6,992,876 B1 | 1/2006 | Nakajima et al. |
| 7,718,932 B2 | 5/2010 | Steger |
| 7,826,724 B2 | 11/2010 | Cunningham et al. |
| 7,939,784 B2 | 5/2011 | Steger et al. |
| 8,059,424 B2 | 11/2011 | Glever et al. |
| 8,445,818 B2 | 5/2013 | Marcus et al. |
| 8,481,897 B2 | 7/2013 | Wöelfel |
| 8,981,259 B2 | 3/2015 | Chou |
| 9,012,811 B2 | 4/2015 | White |
| 9,196,514 B2 | 11/2015 | Parkhe et al. |
| 9,673,025 B2 | 6/2017 | Benjamin et al. |
| 9,693,446 B2 | 6/2017 | Ragg |
| 9,779,974 B2 | 10/2017 | Zhang et al. |
| 2004/0020687 A1 | 2/2004 | Moore |
| 2005/0029013 A1* | 2/2005 | Lee ..................... H05K 1/0251 174/262 |
| 2005/0275418 A1* | 12/2005 | Chong ............... G01R 31/2889 324/750.25 |
| 2010/0282730 A1 | 11/2010 | Marcus et al. |
| 2013/0180973 A1 | 7/2013 | White |
| 2014/0154819 A1* | 6/2014 | Gaff ................. H01L 21/67109 156/345.52 |
| 2016/0379853 A1 | 12/2016 | Schaller et al. |
| 2017/0280509 A1* | 9/2017 | Takebayashi .......... H05B 3/286 |

OTHER PUBLICATIONS

Sharon, Gilad, "Temperature Cycling and Fatigue in Electronics," Published Sep. 28, 2014 in the 2014 SMTA International Conference Proceedings, 9 pages.

* cited by examiner

SUBSTRATE PROCESSING SYSTEM PRINTED-CIRCUIT CONTROL BOARD ASSEMBLY WITH ONE OR MORE HEATER LAYERS

FIELD

The present disclosure relates to substrate processing systems, more particularly to electrostatic chucks in substrate processing systems, still more particularly to printed circuit board assemblies in substrate processing systems, and yet more particularly to apparatus and methods of reducing or attenuating solder joint fatigue in printed circuit board assemblies through temperature control.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. A substrate may be arranged on a pedestal in a processing chamber of the substrate processing system. For example, during etching in a plasma etcher, a gas mixture including one or more precursors is introduced into the processing chamber and plasma is struck to etch the substrate.

The pedestal in the processing chamber may comprise an electrostatic chuck (ESC) to hold substrates in place during etching. The ESC can require heating apparatus and other circuitry mounted in the pedestal to control operation of the ESC. The circuitry may be provided in a printed circuit board assembly (PCBA). A PCBA can be relatively complex, with as many as 250 to 300 components on a single printed circuit board in the PCBA. Those components could include, for example, a field programmable gate array (FPGA), a central processing unit (CPU), and/or various kinds of measurement circuitry, such as a voltage divider circuit. A PCBA also may include multiple layers, each with circuitry mounted thereon. Some of the layers may be primarily grounding layers; others may be power layers; others still may be signaling layers, providing various types of signaling to control operation of the ESC.

Conditions within a substrate processing chamber can vary widely, depending on the process being implemented, and on conditions that can exist between processing operations. The varying conditions include temperature, which can vary outside of operational temperature ranges of circuitry in a PCBA. Those temperature conditions can exist for a sufficiently long time that PCBA circuitry can fail, or otherwise cease to operate. In addition, temperature can continuously cycle over a very wide range, for example from −40° C. to +70° C., in a short time, for example within four minutes, over a long period of time, even a number of days. The cycling is expected throughout the life of the PCBA. The cycling range could be even wider, as colder temperatures (even −60° C. or −80° C. or −140° C.) come into play.

Moreover, large temperature variations impose significant expansion or contraction of materials in the PCBA. Different materials in the PCBA will have different coefficients of thermal expansion, perhaps significantly different. As a result, these materials, which may be soldered or otherwise attached to each other, can expand or contract to different extents, thereby imposing a strain on the solder or other attachments, and causing fatigue. Such fatigue can cause soldered connections to break or otherwise come loose, resulting in PCBA failure, and consequent downtime of the substrate processing chamber.

To avoid effects such as solder joint fatigue, it is desirable to keep PCBAs relatively constant in temperature. But heating a PCBA, for example, could also entail undesired heating of surrounding portions of the substrate processing chamber.

A PCBA may contain measurement circuitry, such as voltage or current measurement circuitry, whose performance can fluctuate widely as a function of temperature. The measurements themselves can vary widely as a function of temperature. If temperature fluctuations of the measurement circuitry on the PCBA are not constrained, it may not be clear whether fluctuating measurements are the result of the fluctuating values themselves, or the changing performance of the measurement circuitry, or a combination of the two.

In view of the foregoing, it would be desirable to provide a mechanism to heat a PCBA locally, without affecting conditions elsewhere in a substrate processing chamber. It also would be desirable to provide a mechanism to promote maintenance of temperature of the PCBA, or of certain components, within a predetermined range.

SUMMARY

According to one feature, a substrate processing system includes a substrate processing chamber, a pedestal arranged in the substrate processing chamber, and an electrostatic chuck (ESC) arranged on the pedestal. The ESC contains a PCBA made up of a plurality of printed circuit board layers to mount circuitry that controls operation of the ESC. One or more of the printed circuit board layers includes a heater layer having one or more metal traces, which may be copper, to cover some or all of a surface of the heater layer sufficiently to provide heat to one or more of the remaining printed circuit board layers, to maintain the circuitry within a predetermined temperature range. The heat may be conducted directly among the various other printed circuit board layers, or may be conducted through vias in various ones of the printed circuit board layers.

According to one feature, a layer of a PCBA is provided with one or more metal traces (copper, in one aspect) that respond to application of current to provide heat to part or all of the PCBA.

In one feature, a single metal trace is provided on the layer, as a single heating element with a single controller. In another feature, multiple metal traces are provided on the layer, as multiple heating elements in parallel with a single controller). In another feature, one or more metal traces connect circuitry on that layer, as multiple heating elements with multiple controllers.

In one feature, temperature of the various layers of the PCBA would be controlled within a specified band. In another feature, temperature within a band would be maintained in one or more regions of the PCBA, but not necessarily for all of the PCBA.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
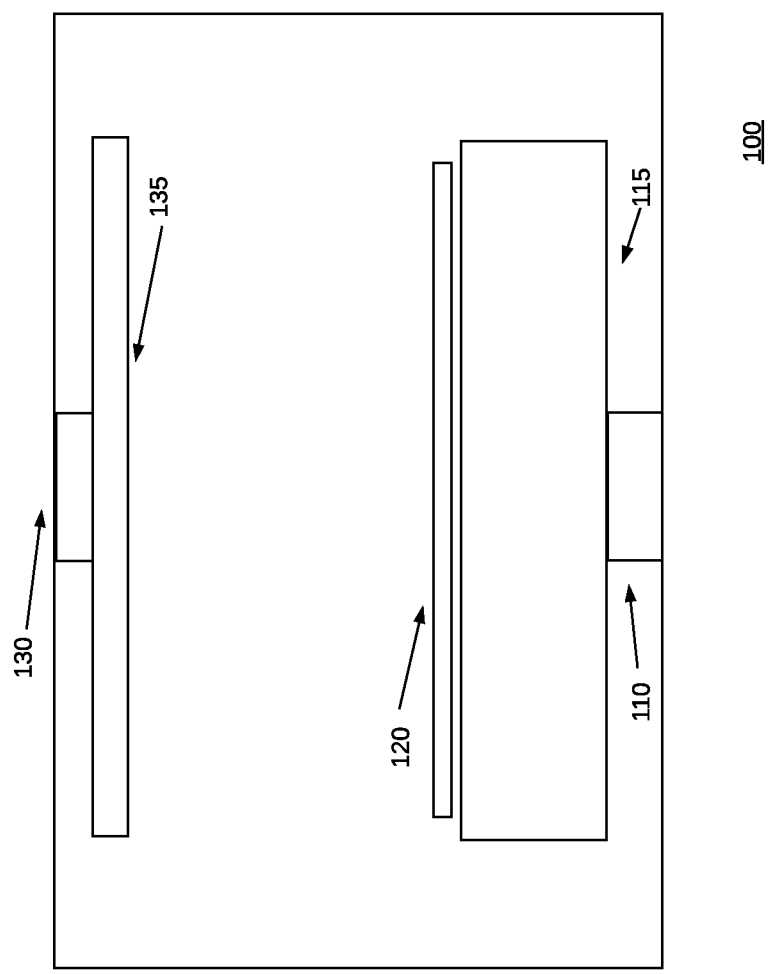
FIG. 1 is a high level diagram of a substrate processing chamber.

FIG. 1 shows a substrate processing chamber 100 which includes a pedestal 110, on which an electrostatic chuck (ESC) 115 may be mounted. A wafer or substrate 120 is positioned on the ESC 115. At the top of the chamber 100, a conduit 130 passes plasma to showerhead 135, which distributes the plasma in the chamber 100. In FIG. 1, conduit 130 and showerhead 135 are provided merely as examples of plasma distribution apparatus. The precise distribution structure does not matter.

Figure 2:
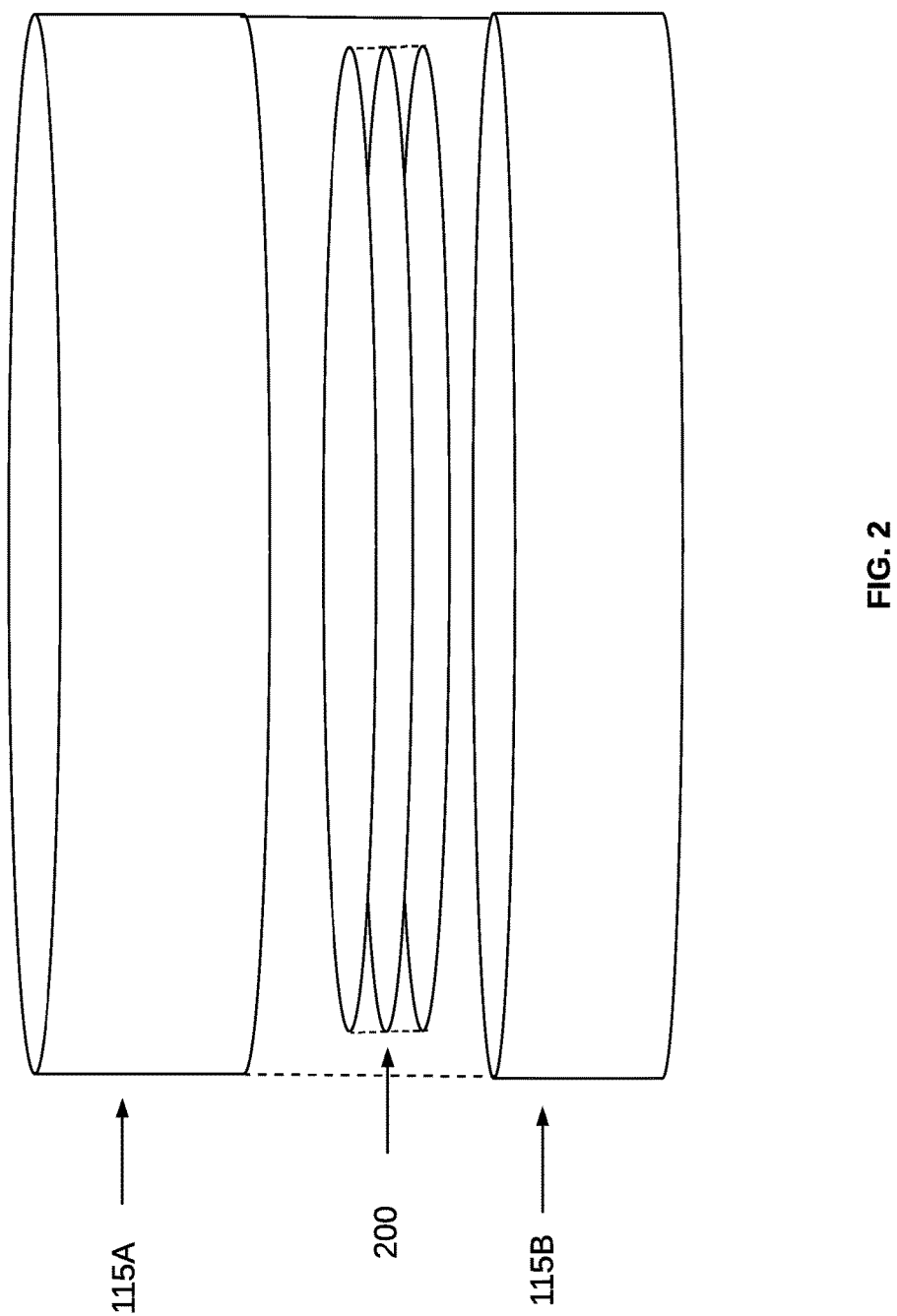
FIG. 2 is a high level exploded diagram of a pedestal in a substrate processing chamber, with a PCBA contained therein.

FIG. 2 shows a cutaway version of ESC 115, with halves 115A, 115B. Various structures, including a heater (whether a coil heater or a pixelated heater, for example) is contained within ESC 115. In one aspect, toward the bottom of ESC 115, a PCBA 200 may be provided. A few layers of PCBA 200 are shown for illustrative purposes. In one aspect, as will be discussed in more detail herein, PCBA 200 has a complicated structure, with multiple layers. Different layers may have different circuitry or other items disposed on one or both sides. Some of the layers may be connected to each other through vias in the layers.

Figure 3:
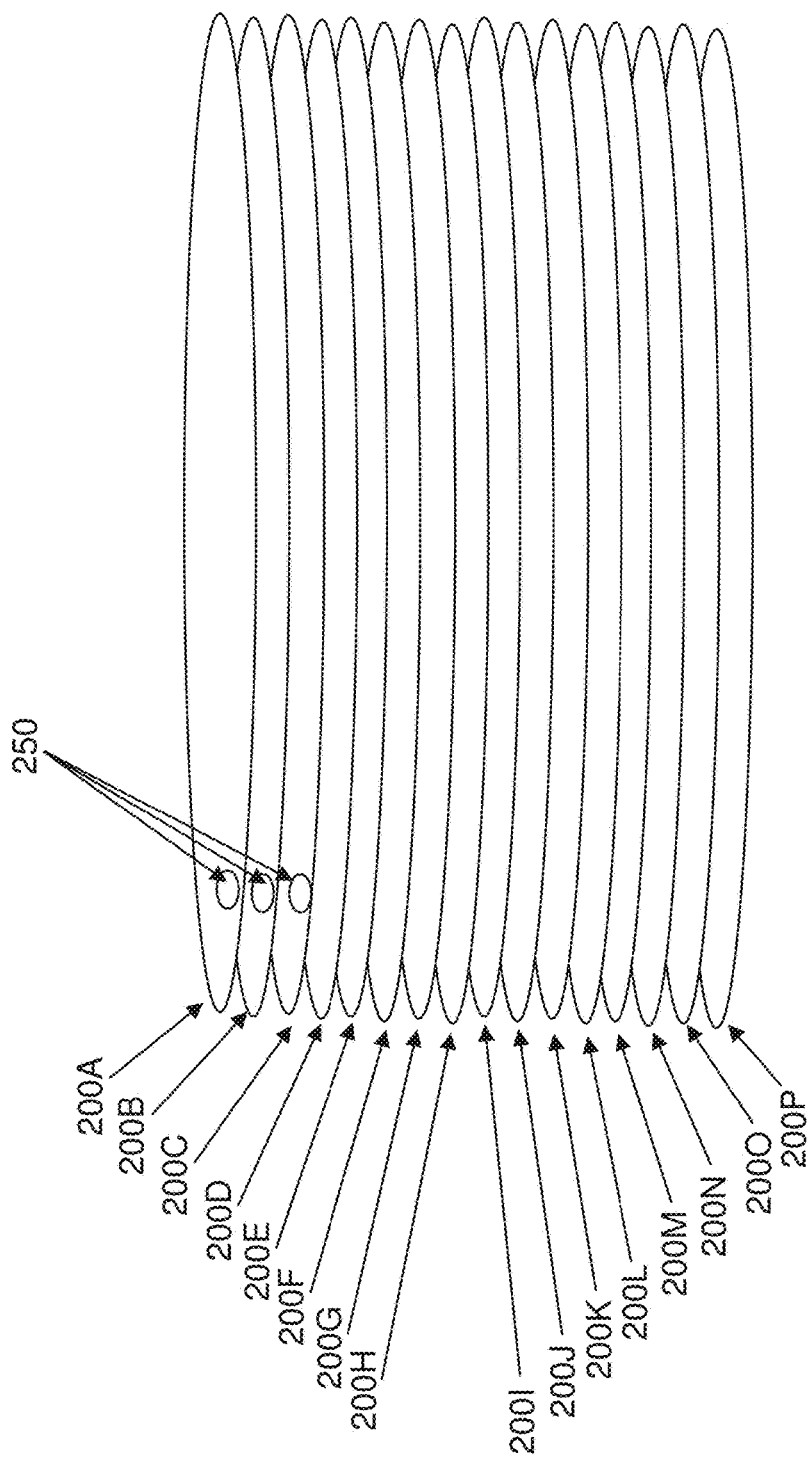
FIG. 3 is one view of a PCBA, in slightly exploded view, to show multiple layers.

FIG. 3 shows a PCBA 200 with layers 200A, 200B, 200C, . . . , 200N, 200O, 200P, according to one aspect. For purposes of illustration here, PCBA 200 is shown as including 16 layers. There may be more layers, or fewer layers. In one aspect, as will be discussed, in addition to grounding layers, power layers, and signaling layers, one or more heater layers are included. Vias 250 in respective layers 200A, 200B, and 200C may facilitate connections among appropriate ones of the layers, as will be discussed.

In one aspect, there may be symmetry among the layers, in that, for example, outer layers, in the upper and lower halves of the overall PCBA, may constitute ground planes, while inner layers may include various kinds of power circuitry, or signaling circuitry. The layers also may be connected to each other using various vias.

Figure 4:
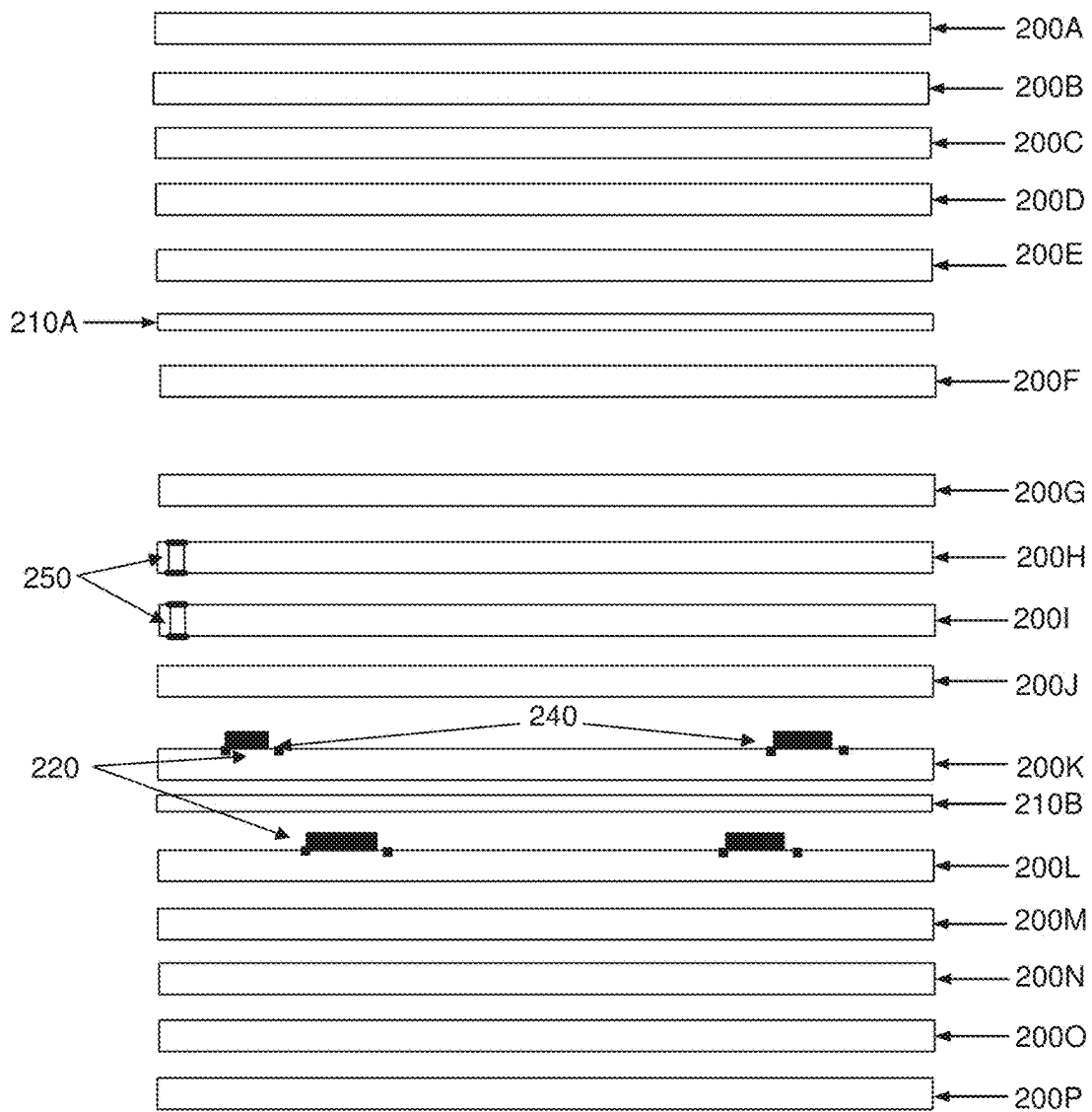
FIG. 4 is a more exploded view of a PCBA according to one aspect.

Looking more closely at configuration and/or function of the different layers, in one aspect, in FIG. 4, top and bottom layers 200A and 200P may constitute signal layers, including soldering pads, or footprints, to which various components are soldered. Layers 200B and 200O may be ground layers. Layers 200C, 200D and layers 200M, 200N may be signal layers. Layers 200E and 200L may be further ground layers. Layers 200F and 200K may be heater layers. Layer 200G may be a further grounding layer. Layers 200H-200J may be power transmission layers.

In one aspect, there is a laminate 210A above heater layer 200F, and a laminate 210B below heater layer 200K. The thickness of These laminates may be thinner than ones that are in-between the remaining layers in the PCBA and are not shown, for example the laminate in-between layers 200P and 200O, in-between layers 200O and 200N.

In one aspect, layers 200B and 200E are ground planes. These ground planes may be connected to each other through various vias such as vias 250, which are shown in layers 200H and 200I purely for illustrative purposes. There may be any number of vias 250 in any of the layers in the PCBA, connecting various layers in the PCBA as appropriate, and as will be understood by ordinarily skilled artisans.

In one aspect, similar to layers 200B and 200E, layers 200L and 200O are ground planes, which also may be connected to each other through various vias such as vias 250.

In one aspect, laminate 210A facilitates heat transfer from heater layer 200F to ground layer 200E. Laminate 2106 facilitates heat transfer from heater layer 200K to ground layer 200L. The two thinner laminates provide easier heat transfer to ground layers 200E, 200L. Heat from those layers 200E, 200L may be sucked up through vias to other ground layers 200E and 200L, to ground layers 200B, 200O, so that heat from those ground layers 200B, 200O may be used to heat top and bottom layers 200A, 200P.

Heater layer 200F includes metal trace layers, as will be discussed below with respect to FIG. 5. In one aspect, these metal trace layers are copper. In another aspect, heater layer 200F contains these metal trace layers, separately from, for example, ground layers 200B and 200O because ground layers 200B, 200O have to provide a ground reference for signals on top and bottom layers 200A, 200P.

In one aspect, it is possible to merge heater layer 200F into heater layer 200B, and/or heater layer 200K into heater layer 200O. There may be fewer layers as a result, and the overall structure may be more efficient. However, the merged layers will be more complex.

In one aspect, heater layers 200F and 200K have identical traces. Each layer may be a single trace, with end of the layer 200F trace being connected to an end of the layer 200K trace. When injecting a DC current into a beginning of the trace in layer 200F, current flows out of the end of the layer 200F trace, then into the end of layer 200K trace, and finally returning out of the beginning of the layer 200K trace, to heat both layers. The current flow directions in the two heater layers are exactly opposite. In this fashion, it is possible to reduce electromagnetic interference (EMI) to other printed circuit board layers, and in particular to the signals generated in those layers. Another way of describing this is the improvement of electromagnetic capability (EMC) in those other printed circuit board layers.

Figure 5:
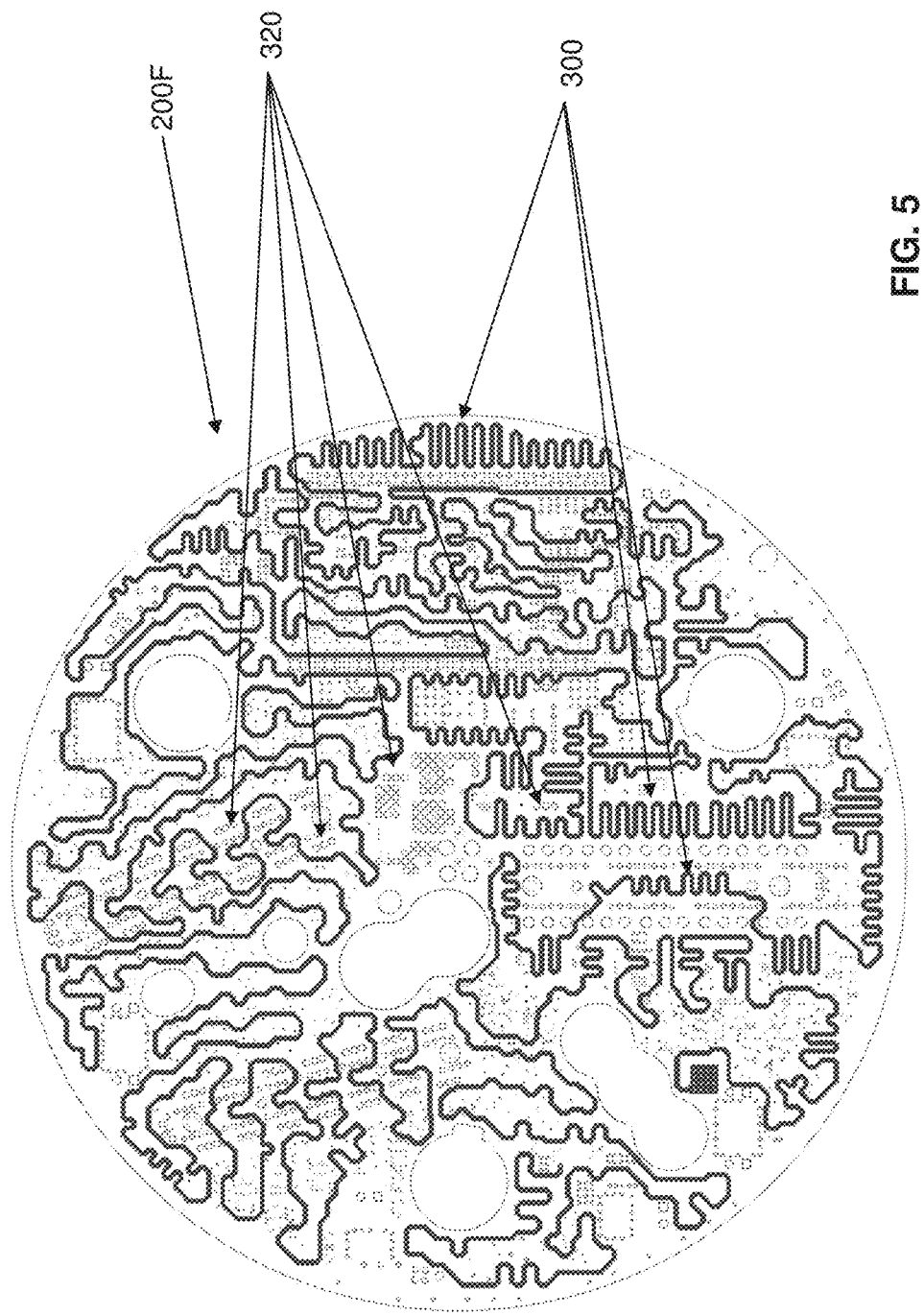
FIG. 5 is a view of one layer of a PCBA showing metal traces according to one aspect.

FIG. 5 shows heater layer 200F with metal trace 300 (which may be copper). In FIG. 5, there are several arrows pointing at trace 300, but in one aspect, as shown in FIG. 5, there is a single trace 300. FIG. 5 shows trace 300 extending through various places on heater layer 200F where circuitry may be provided. In one aspect, trace 300 moves in, out, and among pins such as pins 320, on which a daughterboard (not shown) may be mounted, or to which integrated circuit devices (ICs) may be soldered. The trace 300 covers a large amount of territory on printed circuit board layer 200F, so that heat generated by applying a current through the trace 300, is distributed throughout the surface of heater layer 200F. This type of distribution would be one way to have heat distributed throughout others of the layers 200A-200P, with or without the vias 250 discussed earlier.

While FIG. 5 shows a single metal (copper) trace 300, according to different aspects, there may be multiple such traces 300 provided, in different regions of heater layer 200F. The different traces 300 may be controlled separately, in ways that will be appreciated by ordinarily skilled artisans. Controlling different traces 300 at different times, or to different degrees, can accomplish more efficient temperature control within PCBA 200, by selectively heating different regions by different amounts, or at different times.

Figure 6:
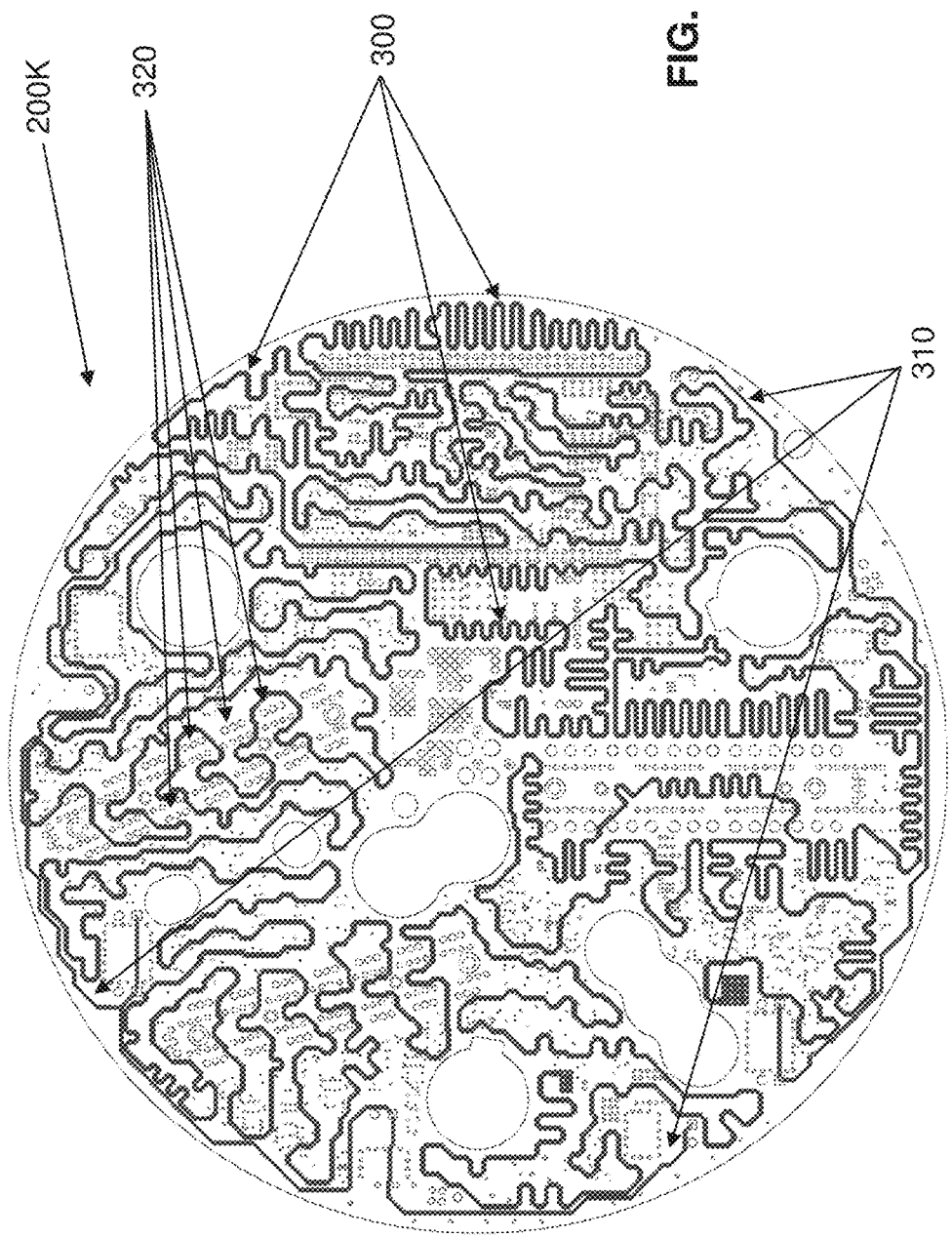
FIG. 6 is a view of one layer of a PCBA showing metal traces according to one aspect.

FIG. 6 shows heater layer 200K with metal trace 300 (which may be copper). In FIG. 6, there are several arrows pointing at trace 300, but in one aspect, as shown in FIG. 6, there is a single trace 300. FIG. 6 shows trace 300 extending through various places on heater layer 200K where circuitry may be provided. In one aspect, trace 300 moves in, out, and among pins such as pins 320, on which a daughterboard (not shown) may be mounted, or to which integrated circuit devices (ICs) may be soldered. The trace 300 covers a large amount of territory on printed circuit board layer 200K, so that heat generated by applying a current through the trace 300, is distributed throughout the surface of heater layer 200K. This type of distribution would be one way to have heat distributed throughout others of the layers 200A-200P, with or without the vias 250 discussed earlier.

While FIG. 6 shows a single metal (copper) trace 300, according to different aspects, there may be multiple such traces 300 provided, in different regions of heater layer 200F. The different traces 300 may be controlled separately, in ways that will be appreciated by ordinarily skilled artisans. Controlling different traces 300 at different times, or to different degrees, can accomplish more efficient temperature control within PCBA 200, by selectively heating different regions by different amounts, or at different times. FIG. 5 and FIG. 6 show similar traces 300. In FIG. 6, there are additional traces 310.

Figure 8:
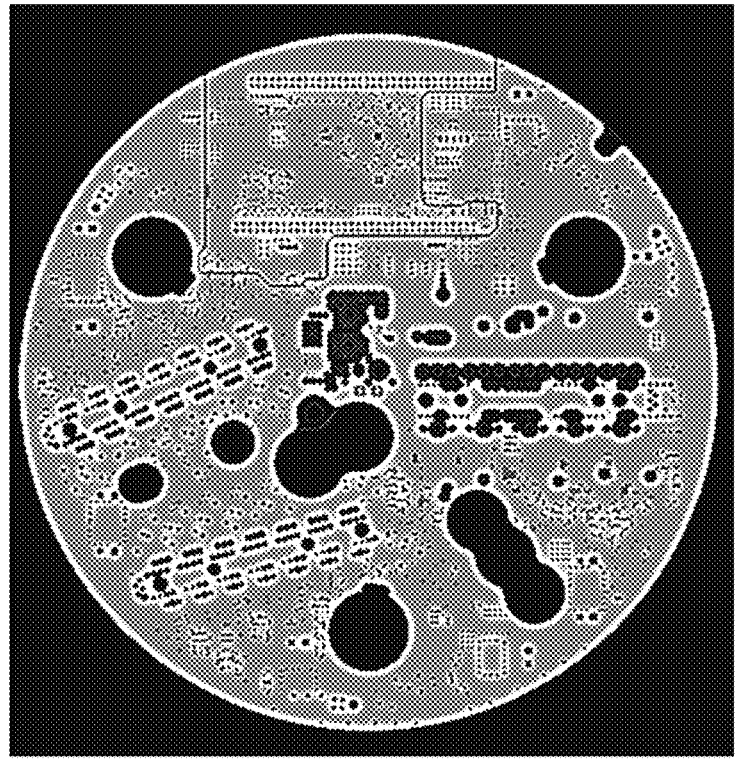
FIG. 8 is a view of another layer of a PCBA according to one aspect.
Figure 7:
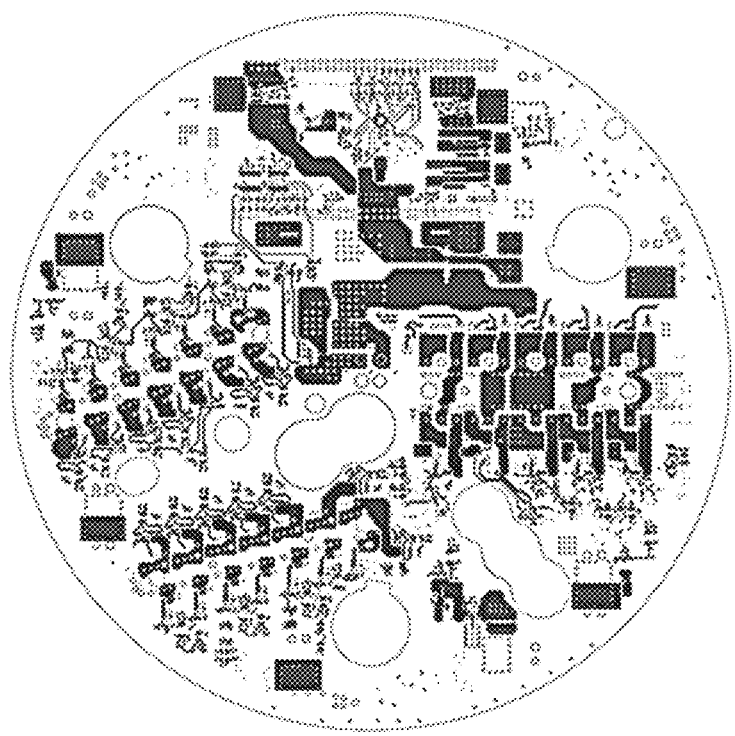
FIG. 7 is a view of one layer of a PCBA according to one aspect.

FIGS. 7 and 8 depict other printed circuit board layers in the PCBA 200, showing different types of circuitry and structure that can be provided on these printed circuit board layers. In one aspect, these printed circuit board layers could be in any position in the PCBA 200. Consequently, the printed circuit board layers in FIGS. 7 and 8 are unnumbered.

Based on the disclosure provided herein, various examples of temperature control will be familiar to ordinarily skilled artisans. Merely by way of example and not by way of limitation, the heater layers 200F, 200K could be turned on when temperature sensors on board the PCBA 200 indicate a temperature below a predetermined temperature, or outside of a predetermined temperature range. For example, it may be desirable to control the temperature in part or all of the PCBA 200 to be within a small range, such as 1° C. to 5° C., to reduce fluctuations in readings from measurement devices on board the PCBA 200.

The provision of heater layers 200F, 200K among the plurality of printed circuit board layers 200A-200P provides the following advantages, among others. First, provision of heat is localized to the printed circuit board layers themselves. Other approaches, which apply heat externally, can heat the area outside of the printed circuit board layers, when heat may not be desirable, and in fact may counteract the desired temperature in the chamber. As alluded to earlier, there can be substantial swings in temperature within substrate processing chamber 100. When the temperature is very low, for example, −40° C., it will be desirable to heat the printed circuit board layers 200A-200P locally, and thus avoid heating other parts of the chamber 100. An attendant effect of localized heating is greater power efficiency compared to heating using heat sources outside of the PCBA 200. In addition, localized heating can permit temperature cycling elsewhere in the substrate processing chamber 100, where such cycling may be desirable. The effect is to basically decouple heating of components in PCBA 200 from the heating of other components in chamber 100, such as an enclosure that desirably may be very cold (for example, minus 40 or more degrees Celsius).

Second, the functions being performed in some of the printed circuit board layers 200A-200P include various kinds of current and/or voltage measurement. Such measurements can fluctuate in different temperature conditions. For example, when one or more resistors in a voltage divider circuit move up and down in temperature, there will be a variation in the amount of current per degree Celsius that the voltage divider will measure. By applying heat internally to the PCBA 200 to keep it at a temperature within a predetermined range, the measurement circuitry (for example, voltage dividers) can operate stably, meaning that fluctuations in current are attributable to other circuitry, not to the measurement circuitry. The effect of this thermal stability is greater accuracy and consistency of measurement.

Third, referring back to FIG. 4, limiting a range of temperatures within PCBA 200 reduces fatigue on solder joints, such as solder joints 240, which affix integrated circuits (IC) 220 to appropriate ones of the printed circuit board layers 200A-200P in PCBA 200. Reduced solder joint fatigue means that ICs 220 will be less likely to detach from the printed circuit board layers to which they are affixed.

Another aspect of this just-described advantage is reduction in thermal fatigue, not only of solder joints, but of other components in the PCBA 200 which can have widely different thermal coefficients of expansion (TCE).

Fourth, looking again at FIG. 5 and the example of a daughterboard mounted to a printed circuit board layer such as layer 200F, such a daughterboard may have a plurality of pins, such as spring-loaded pogo pins, through which high amounts of current will run. Atmospheric conditions such as condensation and freezing can lock circuitry in place and prevent contact. When there is separation and high current, there can be arcing, which can destroy contacts and otherwise damage a printed circuit board. Keeping such a printed circuit board within a predetermined temperature range can prevent such atmospheric conditions, and corresponding catastrophic damage.

Fifth, the one or more heater layers 200F, 200K in PCBA 200, with traces 300 located extensively throughout, can act as a shield layer with respect to other printed circuit board layers in the PCBA 200.

Sixth, as referred to earlier, by having multiple traces 300 in different parts of the one or more heater layers 200F, 200K, it will be possible to control heating of different regions of the PCBA 200 independently, yielding greater efficiency in operation. Relatedly, by having the traces 300 cover large portions of the surface of heater layer 200F, 200K, the heating effect, whether within a region or throughout the heater layer 200F, 200K will be more uniform. Particularly for relatively large PCBAs (for example, 10" in diameter), having discrete resistors instead of metal traces can result in heating in isolated zones of the PCBA rather than in contiguous regions.

Seventh, the heater layers 200F, 200K can be powered using the same voltage as in other layers in the PCBA 200. Alternatively, the heater layers 200F, 200K can be powered using a voltage that is derived from the voltage as in other layers in the PCBA 200.

Eighth, it is possible for the heater layers 200F, 200K to keep the entire PCBA, including all components on the PCBA, above the freeze point, or above the sounding metal plate, such that the circuits are immune from the risk of condensation or icing.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. In a substrate processing system comprising a substrate processing chamber and an electrostatic chuck (ESC) inside the substrate processing chamber to hold substrates,
a printed circuit board assembly (PCBA) comprising a plurality of printed circuit board layers, wherein one or more of the plurality of printed circuit board layers are configured to mount circuitry that controls operation of the ESC, wherein the circuitry includes a field programmable gate array (FPGA), a central processing unit (CPU), and a voltage divider, the plurality of printed circuit board layers comprising a first printed circuit board layer containing a first metal trace to cover a first region of the first printed circuit board layer, the first metal trace being used to provide heat to one or more others of the plurality of printed circuit board layers to maintain the circuitry within a predetermined temperature range.

2. The PCBA of claim 1, wherein the plurality of printed circuit board layers further comprises a second printed circuit board layer containing a second metal trace to cover a second region of the second printed circuit board layer, the first and second metal traces being used to provide heat to one or more others of the plurality of the printed circuit board layers to maintain the circuitry within the predetermined temperature range.

3. The PCBA of claim 1, wherein the first region covers substantially all of the first printed circuit board layer.

4. The PCBA of claim 1, wherein the circuitry that controls operation of the ESC includes first circuitry mounted on the first printed circuit board layer.

5. The PCBA of claim 2, wherein the second region covers substantially all of the second printed circuit board layer.

6. The PCBA of claim 2, wherein the circuitry that controls operation of the ESC includes second circuitry on the second printed circuit board layer.

7. The PCBA of claim 4, wherein the first metal trace connects the first circuitry mounted on the first printed circuit board layer.

8. The PCBA of claim 6, wherein the second metal trace connects the second circuitry mounted on the second printed circuit board layer.

9. The PCBA of claim 2, wherein the plurality of printed circuit board layers comprises grounding layers, powering layers, and signaling layers, and the first and second printed circuit board layers are interspersed among the grounding layers, the powering layers, and the signaling layers.

10. The PCBA of claim 1, wherein the plurality of printed circuit board layers is arranged in a stack, and the first printed circuit board layer is disposed toward a middle of the stack.

11. The PCBA of claim 10, wherein two or more of the plurality of printed circuit board layers include vias, and wherein the vias conduct the heat from the first metal trace in the first printed circuit board layer to other printed circuit board layers in the stack.

12. The PCBA of claim 2, wherein the plurality of printed circuit board layers is arranged in a stack, and the first and second printed circuit board layers are disposed toward a middle of the stack.

13. The PCBA of claim 12, wherein two or more of the plurality of printed circuit board layers include vias, and wherein the vias conduct the heat from the first and second metal traces in the corresponding first and second printed circuit board layers to other printed circuit board layers in the stack.

14. The PCBA of claim 1, wherein the first printed circuit board layer has a plurality of metal traces, each of the plurality of metal traces covering a corresponding region in the first printed circuit board layer.

15. The PCBA of claim 14, wherein an amount of heat provided by each of the plurality of metal traces is independently controlled.

16. The PCBA of claim 2, wherein each of the first and second printed circuit board layers has a plurality of metal traces, each of the plurality of metal traces covering a corresponding region in a respective one of the first and second printed circuit board layers.

17. The PCBA of claim 16, wherein an amount of heat provided by each of the plurality of metal traces is independently controlled.

18. In a substrate processing system comprising a substrate processing chamber and an electrostatic chuck (ESC) inside the substrate processing chamber to hold substrates,
a printed circuit board assembly (PCBA) comprising a plurality of printed circuit board layers, wherein one or more of the plurality of printed circuit board layers are configured to mount one or more integrated circuits (ICs) that control operation of the ESC,
the plurality of printed circuit board layers comprising:
a first printed circuit board layer containing a first metal trace to cover a first region of the first printed circuit board layer; and
a second printed circuit board layer containing a second metal trace to cover a second region of the second printed circuit board layer,
wherein the first and second metal traces are arranged such that current flows through the first metal trace in a first direction and current flows through the second metal trace in a second direction that is opposite the first direction,
the first metal trace and the second metal trace being used to provide heat to one or more others of the plurality of printed circuit board layers to maintain the one or more ICs within a predetermined temperature range.

19. In a substrate processing system comprising a substrate processing chamber and an electrostatic chuck (ESC) inside the substrate processing chamber to hold substrates,
a printed circuit board assembly (PCBA) comprising a plurality of printed circuit board layers, wherein one or more of the plurality of printed circuit board layers are configured to mount a controller that controls operation of the ESC and that controls at least one of: delivery of processing gases, pressure settings, vacuum settings, power settings, radio frequency (RF) generator settings, RF matching circuit settings, frequency settings, flow rate settings, fluid delivery settings, positional and operation settings, and wafer transfer,
the plurality of printed circuit board layers comprising a first printed circuit board layer containing a first metal trace to cover a first region of the first printed circuit board layer, the first metal trace being used to provide heat to one or more others of the plurality of printed circuit board layers to maintain the controller within a predetermined temperature range.

* * * * *